(12) United States Patent
Nogami et al.

(10) Patent No.: US 8,878,333 B2
(45) Date of Patent: Nov. 4, 2014

(54) SEMICONDUCTOR DEVICE HAVING IMPROVED RF CHARACTERISTICS AND MOISTURE RESISTANCE AND METHOD FOR MANUFACTURING THE SAME

(75) Inventors: Youichi Nogami, Tokyo (JP); Hidetoshi Koyama, Tokyo (JP); Yoshitsugu Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 205 days.

(21) Appl. No.: 13/545,046

(22) Filed: Jul. 10, 2012

(65) Prior Publication Data

US 2013/0056875 A1    Mar. 7, 2013

(30) Foreign Application Priority Data

Sep. 1, 2011  (JP) ................. 2011-190751

(51) Int. Cl.
*H01L 21/70* (2006.01)
*H01L 23/482* (2006.01)

(52) U.S. Cl.
CPC .......... *H01L 23/4821* (2013.01); *H01L 23/482* (2013.01)
USPC ................... 257/522; 257/758; 257/E23.013; 438/619

(58) Field of Classification Search
CPC .................................................. H01I 23/4821
USPC ................................... 257/E23.013; 438/619
See application file for complete search history.

(56) References Cited

U.S. PATENT DOCUMENTS 7,262,444 B2 *   8/2007  Fillion et al. ................ 257/177
2010/0270687 A1  10/2010 Fujihara

FOREIGN PATENT DOCUMENTS

| JP | 10-107076 A | 4/1998 |
| JP | 2009-184067 A | 8/2009 |
| JP | 2010-258202 A | 11/2010 |

* cited by examiner

*Primary Examiner* — Wensing Kuo
*Assistant Examiner* — Shaka White
(74) *Attorney, Agent, or Firm* — Leydig, Voit & Mayer, Ltd.

(57) ABSTRACT

A semiconductor device includes: a semiconductor substrate having a main surface; an electrode in a device region on the main surface; a metal wiring on the main surface and having a first end connected to the electrode; an electrode pad outside the device region and spaced from the metal wiring; an air gap between the main surface and an air gap forming film on the main surface, enveloping the first end of the metal wiring and the electrode, and having a first opening; a resin closing the first opening and covering a second end of the metal wiring; a liquid repellent film facing the air gap and increasing contact angle of the resin, when liquid, relative to contact angles on the semiconductor substrate and the air gap forming film; and a metal film connecting the metal wiring to the electrode pad through a second opening located in the resin.

4 Claims, 16 Drawing Sheets

7 6 3 4 5 2 4 3 6 1

7 6 3 4 5 2 4 3 6 1

SEMICONDUCTOR DEVICE HAVING IMPROVED RF CHARACTERISTICS AND MOISTURE RESISTANCE AND METHOD FOR MANUFACTURING THE SAME

BACKGROUND OF THE INVENTION

1. Field of the Invention

The present invention relates to a semiconductor device and method for manufacturing the same using a non-hermetic package such as a mold package, and in particular to a semiconductor device and method for manufacturing the same which can prevent deterioration of radiofrequency characteristics and improve the moisture resistance.

2. Background Art

Schemes to generalize radiofrequency semiconductor devices such as field effect transistors using a chemical compound semiconductor such as GaAs or GaN are rapidly progressing and there is a strong demand for a cost reduction effect. As a means for meeting this demand, using low-priced mold packages instead of completely hermetic metal packages heretofore used has become practical. In a case where a non-hermetic package such as a mold package is used for a semiconductor device, however, it is necessary to improve the moisture resistance of the semiconductor device in order to prevent deterioration in various respects due to causes relating to water.

Conventionally, electrodes provided on a main surface of a semiconductor substrate are covered with thick insulating film such as SiN film formed by plasma CVD or the like, thereby preventing permeation of water and securing the moisture resistance.

The existence of the thick insulating film having a high dielectric constant between the semiconductor substrate and the electrodes, however, entails a problem that the capacitive components are increased and the radiofrequency characteristics are deteriorated. Insulating film formed by plasma CVD or the like easily absorbs moisture, depending on the film forming condition. If the film thickness is increased, the insulating film can be separated by a change in stress when it absorbs a small amount of water. In such case, the coverage and film quality at a stepped portion of a transistor are deteriorated to allow water to easily pass through or to be absorbed in the film. It is, therefore, difficult to effectively prevent permeation of water to the transistor.

A semiconductor device has been proposed that has a construction for preventing deterioration of radiofrequency characteristics in which an air gap is formed between a main surface of a semiconductor substrate and an air gap forming film; the air gap envelops gate electrodes and drain electrodes; and an opening of the air gap is closed with a resin (see, for example, Japanese Patent Laid-Open No. 2009-184067, particularly FIGS. 30 and 31).

In Japanese Patent Laid-Open No. 2009-184067, the method of connecting the electrodes in the air gap to electrode pads outside the air gap is not described in detail. In a case where the electrodes and the electrode pads are connected to each other by metal wirings, an end of each metal wiring is connected to the electrode and the other end of the metal wiring is led out of the resin to be connected to the electrode pad. However, a gap can occur easily at the interface between the metal wiring and the resin when the resin is thermally cured in the manufacturing process. As a result, the moisture resistance is deteriorated.

SUMMARY OF THE INVENTION

In view of the above-described problems, an object of the present invention is to provide a semiconductor device and method for manufacturing the same which can prevent deterioration of radiofrequency characteristics and improve the moisture resistance.

According to the present invention, a semiconductor device includes: a semiconductor substrate having a main surface; an electrode in a device region on the main surface; a metal wiring on the main surface and having a first end connected to the electrode; an electrode pad outside the device region on the main surface and distanced from the metal wiring; an air gap forming film on the main surface; an air gap between a part of the main surface and the air gap forming film, enveloping a first end of the metal wiring and the electrode, and having a first opening; a resin closing the first opening and covering a second end of the metal wiring without covering the electrode pad; a liquid repellent film on an internal surface facing the air gap and having such a physical property as to increase a contact angle of the resin in a liquid state relative to those on the semiconductor substrate and the air gap forming film; and a metal film connecting the metal wiring to the electrode pad through a second opening provided in the cured resin, wherein the second end of the metal wiring is not jutted out of the resin.

The present invention makes it possible to prevent deterioration of radiofrequency characteristics and improve the moisture resistance.

Other and further objects, features and advantages of the invention will appear more fully from the following description.

DETAILED DESCRIPTION OF THE PREFERRED EMBODIMENTS

A semiconductor device and method for manufacturing the same according to the embodiments of the present invention will be described with reference to the drawings. The same components will be denoted by the same symbols, and the repeated description thereof may be omitted.

First Embodiment

Figure 1:
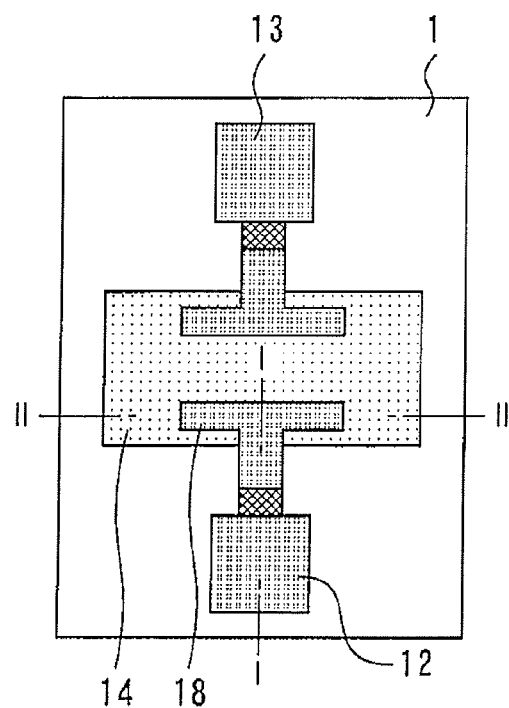
FIG. 1 is a top view of a semiconductor device according to a first embodiment of the present invention.
Figure 2:
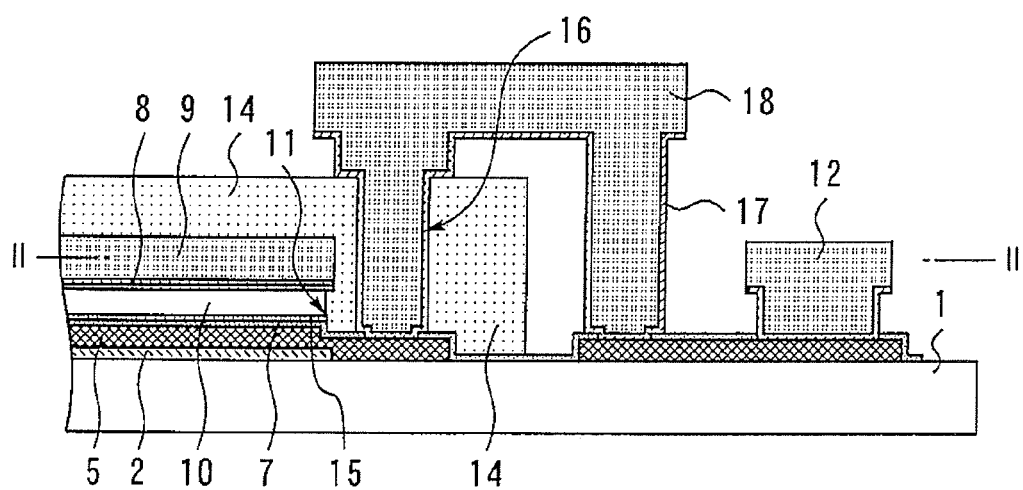
FIG. 2 is a sectional view taken along line I-I in FIG. 1.
Figure 3:
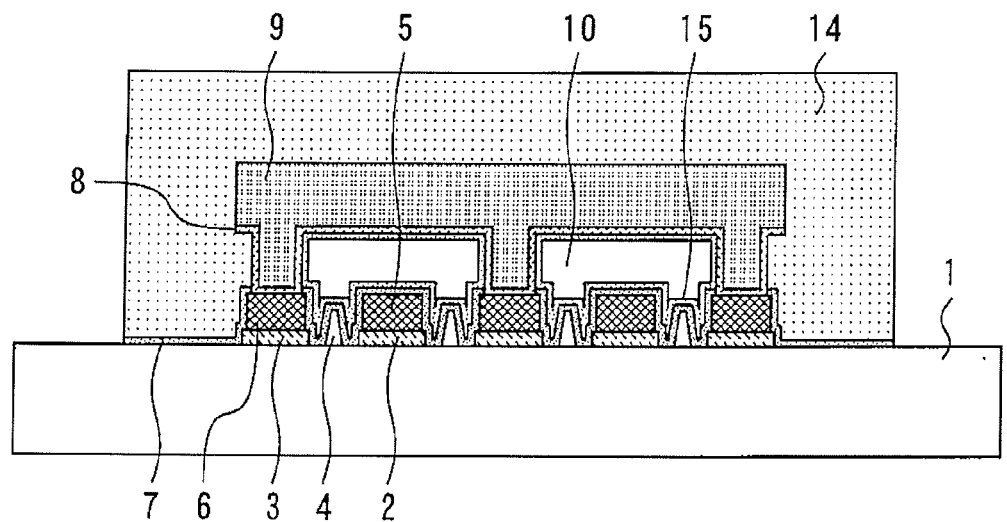
FIG. 3 is a sectional view taken along line II-II in FIG. 1.
Figure 4:
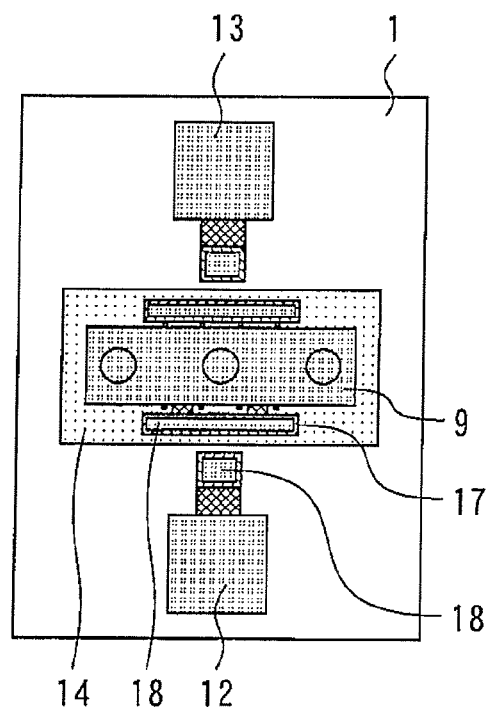
FIG. 4 is a top view at the height corresponding to line II-II in FIG. 2.

FIG. 1 is a top view of a semiconductor device according to a first embodiment of the present invention. FIG. 2 is a sectional view taken along line I-I in FIG. 1. FIG. 3 is a sectional view taken along line II-II in FIG. 1. FIG. 4 is a top view at the height corresponding to line II-II in FIG. 2.

A drain electrode 2 and a source electrode 3 are provided in a device region on a main surface of a semiconductor substrate 1 while being spaced apart from each other. A gate electrode 4 is provided between the drain electrode 2 and the source electrode 3. Each of the drain electrode 2 and the source electrode 3 is an ohmic metal layer. The gate electrode 4 is a Schottky electrode. A drain wiring 5 having its one end connected to the drain electrode 2 is provided on the main surface. A source wiring 6 is also provided on the source electrode 3. These elements constitute a transistor. The surfaces of these elements are protected by a SiN film 7. In a place where the SiN film 7 is not necessary, e.g., a place above the source wiring 6 on the source electrode 3, a contact hole is formed in the SiN film 7.

A plated feed layer 8 and an Au plated layer 9 are provided on the main surface and connected to the source electrode 3 through the source wiring 6. An air gap 10 is formed between the plated feed layer 8/Au plated layer 9 and a portion of the main surface. The air gap 10 envelopes one end of the drain wiring 5, the gate electrode 4 and the drain electrode 2 and has an opening 11. A drain electrode pad 12 and a gate electrode pad 13 are provided outside the device region on the main surface. The drain electrode pad 12 and the drain wiring 5 are distanced from each other.

Cured polyimide film 14 closes opening 11 and covers the other end of the drain wiring 5 without covering the drain electrode pad 12 and the gate electrode pad 13. The other end of the drain wiring 5 is not jutted out of the polyimide film 14. A liquid repellent film 15 is provided on the internal surface facing the air gap 10. The liquid repellent film 15 has such a physical property as to increase the contact angle of the polyimide film 14 in a liquid state relative to those on the semiconductor substrate 1, the plated feed layer 8 and the Au plated layer 9.

Through an opening 16 provided in the cured (imidized) polyimide film 14, the other end of the drain wiring 5 and the drain electrode pad 12 are connected to each other by a plated feed layer 17 and an Au plated layer 18. A gate wiring (not shown) connected to the gate electrode 4 and the gate electrode pad 13 are also connected in the same way.

A method of manufacturing the semiconductor device according to the present embodiment will next be described. FIGS. 5 to 13 are sectional views showing a process of manufacturing the semiconductor device according to the first embodiment of the present invention.

Figure 5:
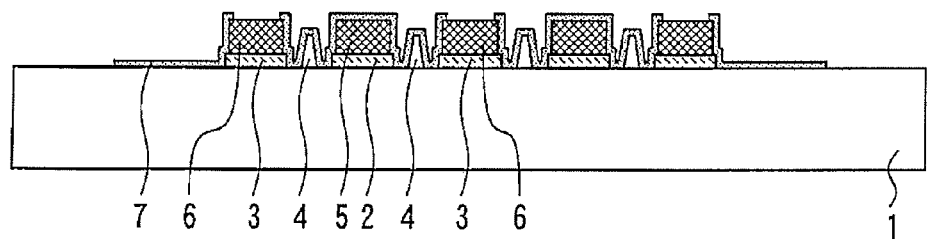
FIGS. 5 to 13 are sectional views showing a process of manufacturing the semiconductor device according to the first embodiment of the present invention.

First, as shown in FIG. 5, the gate electrodes 4, drain electrodes 2 and source electrodes 3 are formed in a device region on the main surface of the semiconductor substrate 1. The drain wirings 5 having their one ends connected to the drain electrode 2 are formed on the main surface. The SiN film 7 is formed as insulating protective film on the surfaces of these elements by plasma CVD, and contact holes are formed in the SiN film 7.

Figure 6:
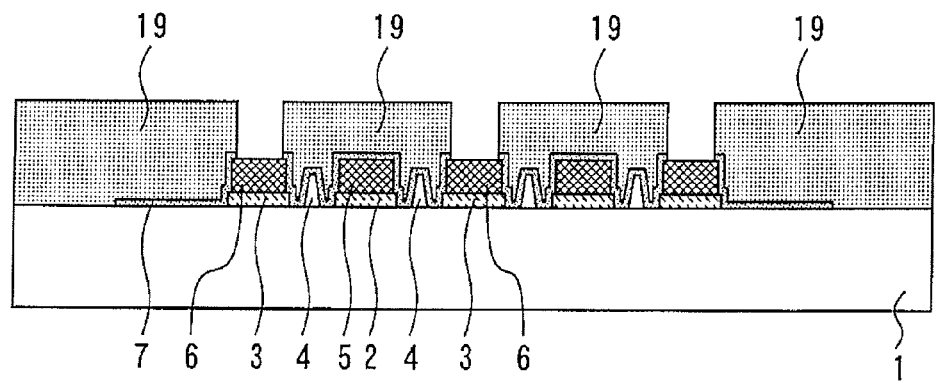

Next, as shown in FIG. 6, a photoresist film 19 is applied to the entire surface and openings are formed in the photoresist film 19 above the source wirings 6 on the source electrodes 3 by a transfer process.

Figure 7:
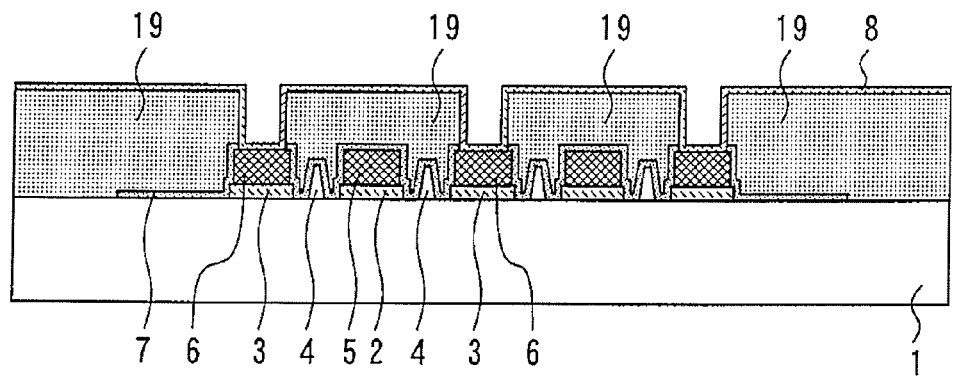

Next, as shown in FIG. 7, the plated feed layer 8 formed of Ti/Au is formed on the entire surface, for example, by sputtering.

Figure 8:
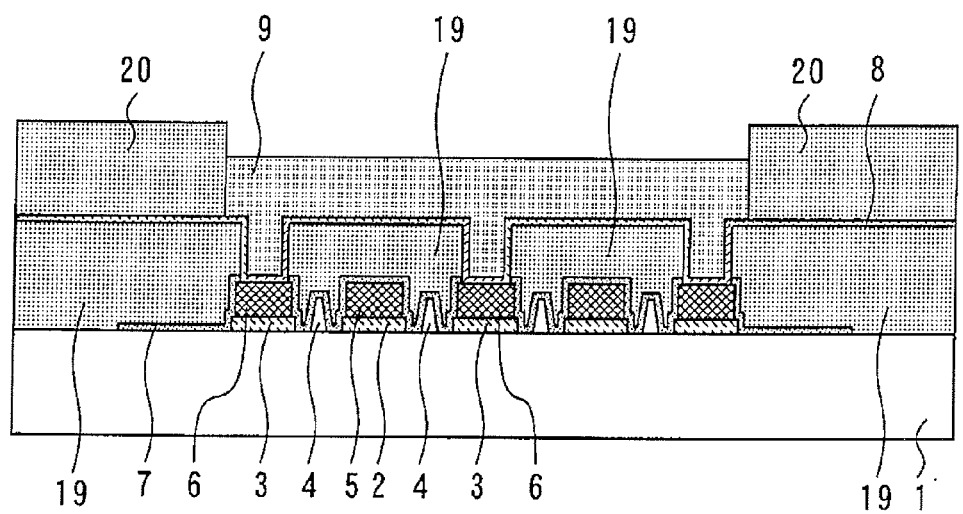

Next, as shown in FIG. 8, a photoresist film 20 is applied to the entire surface and an opening is formed in the photoresist film 20 by a transfer process. Thereafter, the Au plated layer 9 is formed by electrolytic plating on the plated feed layer 8 in the opening in the photoresist film 20. At this time, the drain electrode pad 12 and the gate electrode pad 13 are formed outside the device region on the main surface.

Figure 9:
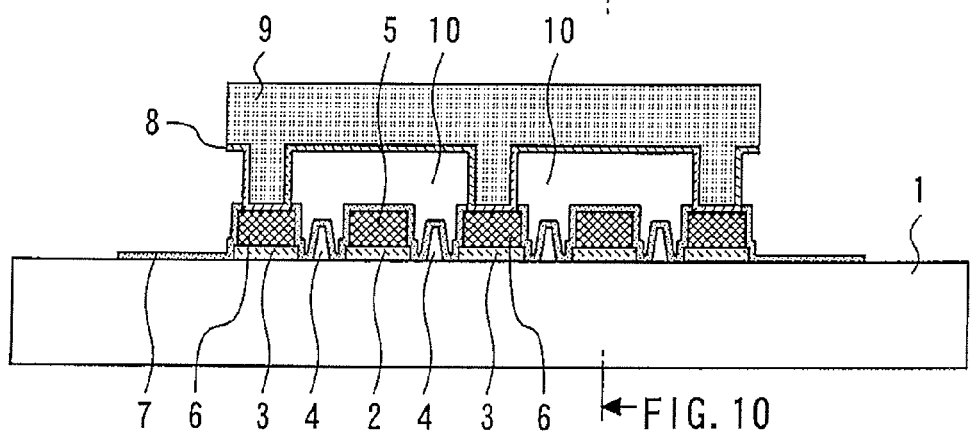
Figure 10:
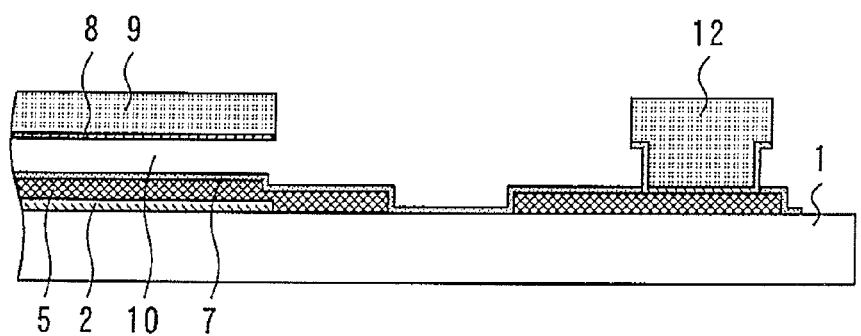

Next, as shown in FIGS. 9 and 10, the photoresist film 20 is removed and the plated feed layer 8 in the region where the photoresist film 20 has been removed is removed, for example, by ion milling. The photoresist film 19 is thereafter removed. The air gaps 10 are thereby formed between the plated feed layer 8/Au plated layer 9 and portions of the main surface.

Figure 11:
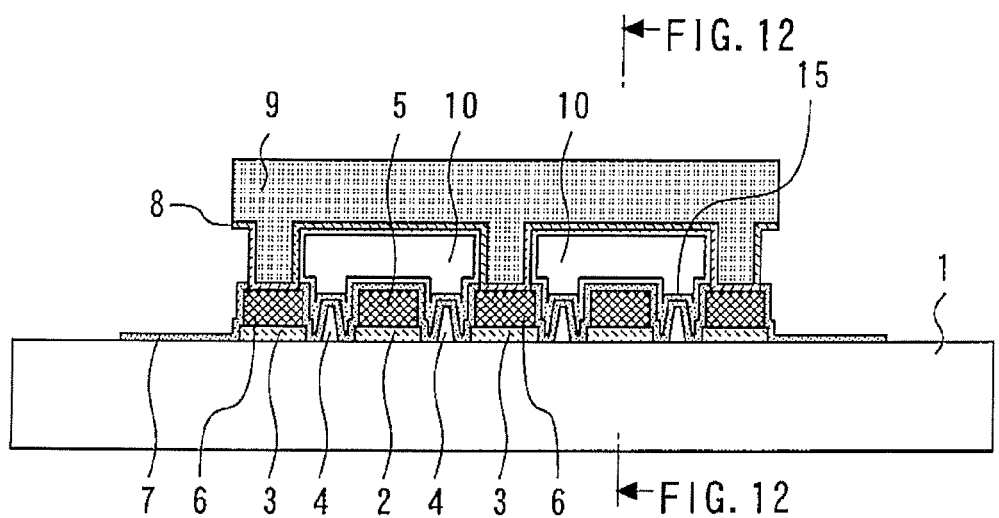
Figure 12:
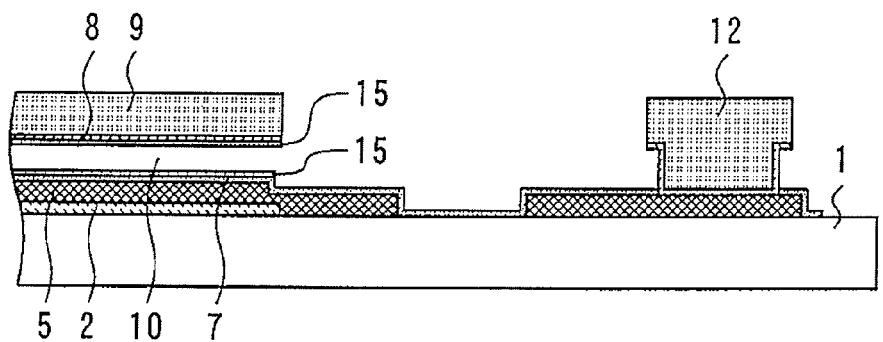

Next, as shown in FIGS. 11 and 12, the liquid repellent film 15 is formed on the entire surface by an isotropic film forming method. The isotropic film forming method is a film forming method of depositing a material to be formed as a film so that the deposited material is generally uniform in thickness no matter what the orientation and position of the surface on which the film is formed. Therefore the liquid repellent film 15 having a sufficient thickness can be formed even on the internal surfaces facing the air gaps 10. Thereafter, the unnecessary liquid repellent film 15 formed on portions other than the internal surfaces facing the air gaps 10 is removed, for example, by anisotropic etching using a RIE apparatus.

Figure 13:
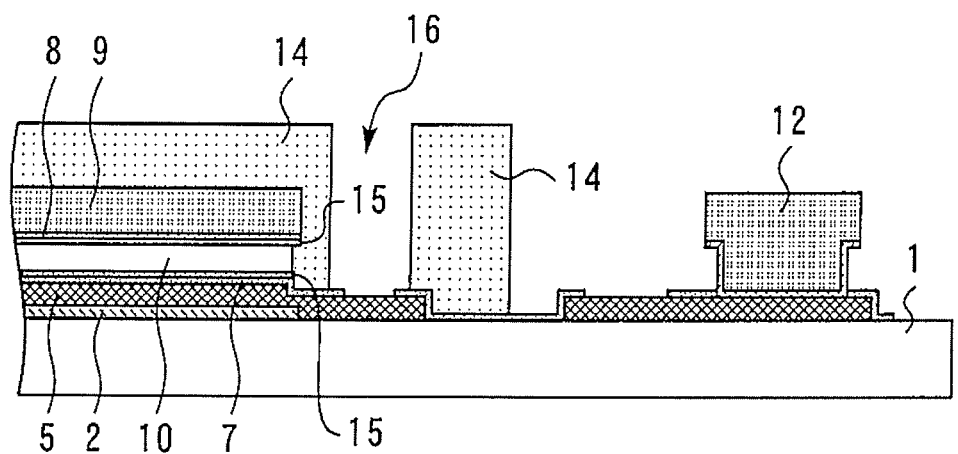

Next, as shown in FIG. 13, a photosensitive polyimide film 14 in liquid form is applied to the entire surface, for example, by using a spray coater or a spin coater. With the polyimide film 14, the openings 11 of the air gaps 10 are closed and the other ends of the drain wirings 5 are covered. The polyimide film 14 is thereafter cured. At this time, the air gaps 10 are maintained by the effect of the liquid repellent film 15 without being filled with the polyimide film 14. Next, the opening 16 is formed in the cured polyimide film 14 on the other ends of the drain wirings 5 by a transfer process.

Next, as shown in FIGS. 1 and 2, the plated feed layer 17 and the Au plated layer 18 are formed and patterned by the same method as that of forming the plated feed layer 8 and the Au plated layer 9. The plated feed layer 17 and the Au plated layer 18 that connect the other ends of the drain wirings 5 and the drain electrode pad 12 to each other through the opening 16 are thereby formed.

The effects of the present embodiment will be described. In the present embodiment, the air gap 10 is formed between the plated feed layer 8/Au plated layer 9 and a portion of the main surface. The air gap 10 envelops one end of the drain wiring 5, the drain electrode 2 and the gate electrode 4 in the device region. Thus, no insulating film of a high dielectric constant exists between the semiconductor substrate 1 and the gate electrode 4 and between the semiconductor substrate 1 and the drain electrode 2. Prevention of deterioration of radiofrequency characteristics is thus enabled.

Figure 14:
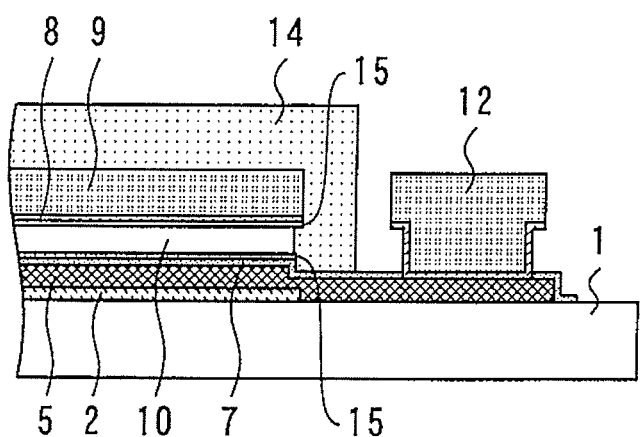
FIG. 14 is a sectional view of a semiconductor device according to the comparative example.

Another effect of the present embodiment will be described through comparison between the present embodiment and a comparative example. FIG. 14 is a sectional view of a semiconductor device according to the comparative example. In the comparative example, the other end of the drain wiring 5 is jutted out of the polyimide film 14 for connection between the other end of the drain wiring 5 and the drain electrode pad 12. Therefore, when the polyimide film 14 is heat-cured in the manufacturing process, a gap occurs at the interface between the drain wiring 5 and the polyimide film 14. This gap can be a path through which water can permeate into the air gap 10, resulting in deterioration of the moisture resistance.

On the other hand, in the present embodiment, the other end of the drain wiring 5 and the drain electrode pad 12 are connected to each other by the plated feed layer 17 and the Au plated layer 18 through the opening 16 provided in the cured polyimide film 14. This construction enables avoiding jutting the other end of the drain wiring 5 out of the polyimide film 14 and, hence, reducing the occurrence of a gap that can be a path through which water can permeate into the air gap 10, thus improving the moisture resistance.

Figure 15:
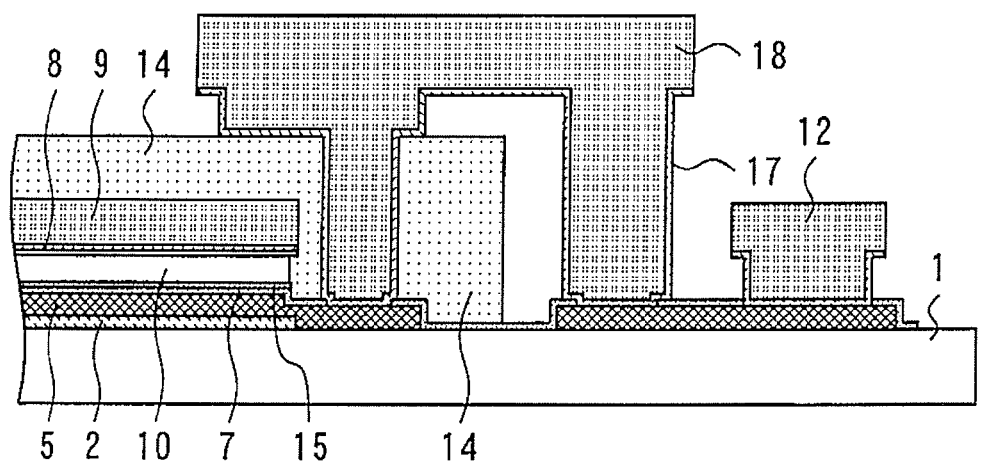
FIG. 15 is a sectional view showing a first modified example of a semiconductor device according to the first embodiment of the present invention.

FIG. 15 is a sectional view showing a first modified example of a semiconductor device according to the first embodiment of the present invention. The plated feed layer 17 and the Au plated layer 18 completely cover a portion right above the opening 11. The moisture resistance can be further improved in this way.

Figure 16:
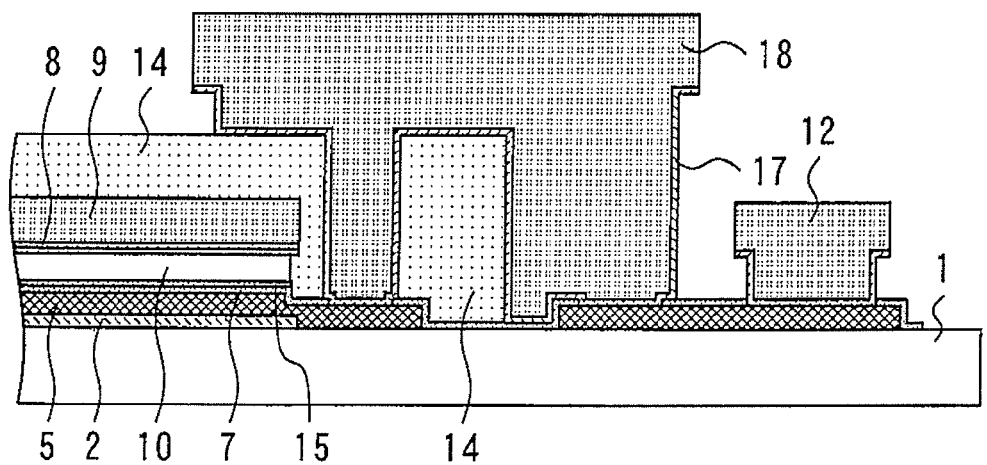
FIG. 16 is a sectional view showing a second modified example of a semiconductor device according to the first embodiment of the present invention.

FIG. 16 is a sectional view showing a second modified example of a semiconductor device according to the first embodiment of the present invention. While the plated feed layer 17 and the Au plated layer 18 are provided as air bridge metal wiring in the above-described embodiment, the plated feed layer 17 and the Au plated layer 18 may alternatively be provided as wiring different from air bridge metal wiring, as shown in FIG. 16. Deposited metal wiring may be substituted for the plated feed layer 17 and the Au plated layer 18 if there is no step-cut problem, depending on the shape of the polyimide film 14.

Insulating protective film such as SiN film may be formed on the polyimide film 14. The plated feed layer 17 and the Au plated layer 18 are then formed on the polyimide film 14, with the insulating protective film interposed therebetween. The adhesion between these layers and the polyimide film 14 is thereby improved. The moisture resistance can be further improved in this way.

Second Embodiment

Figure 17:
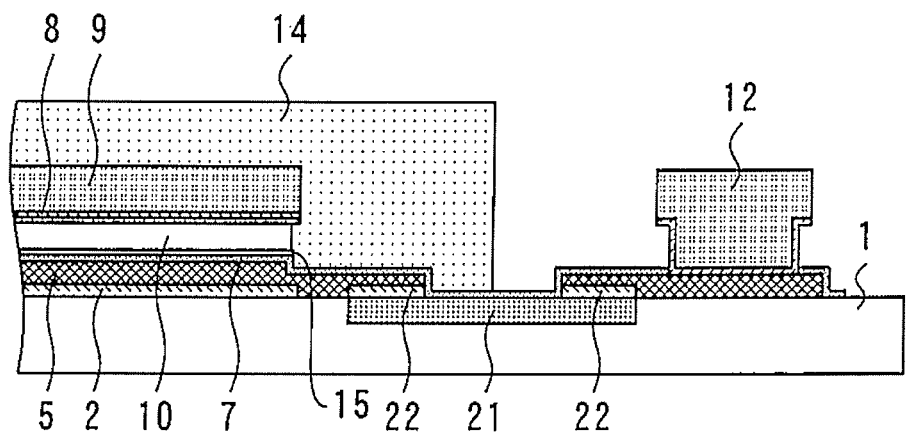
FIG. 17 is a sectional view of a semiconductor device according to a second embodiment of the present invention.

FIG. 17 is a sectional view of a semiconductor device according to a second embodiment of the present invention. In the present embodiment, the drain wiring 5 and the drain electrode pad 12 are connected to each other by an epitaxial resistive layer 21 provided in the semiconductor substrate 1. However, the epitaxial resistive layer 21 is not exclusively used. A semiconductor layer doped with an impurity, such as a doped resistive layer, may suffice.

The periphery of the polyimide film 14 meets the epitaxial resistive layer 21 right above the same. An ohmic metal 22 is provided to make ohmic contact between the epitaxial resistive layer 21 and the drain wiring 5. The connection (not shown) between the gate wiring connected to the gate electrode 4 and the gate electrode pad 13 is also made in the same way.

In the present embodiment, the drain wiring 5 and the drain electrode pad 12 are connected to each other by the epitaxial resistive layer 21 without jutting the other end of the drain wiring 5 out of the polyimide film 14. This construction enables reducing the occurrence of a gap that can be a path through which water can permeate into the air gap 10, thus improving the moisture resistance. Also, since the air gap 10 is formed in the same way as that in the first embodiment, prevention of deterioration of radiofrequency characteristics is also enabled.

Third Embodiment

Figure 18:
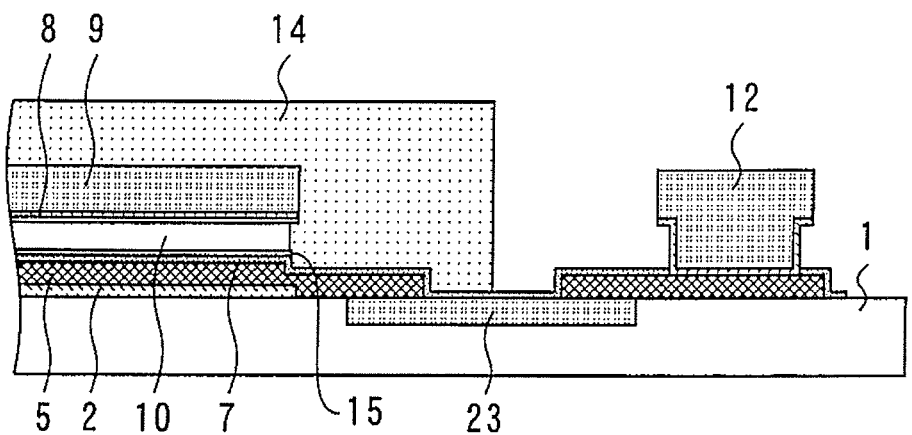
FIG. 18 is a sectional view of a semiconductor device according to a third embodiment of the present invention.

FIG. 18 is a sectional view of a semiconductor device according to a third embodiment of the present invention. In the present embodiment, the drain wiring 5 and the drain electrode pad 12 are connected to each other by a metal layer 23 embedded in the semiconductor substrate 1. The connection (not shown) between the gate wiring connected to the gate electrode 4 and the gate electrode pad 13 is also made in the same way. The other components are the same as those in the second embodiment. The same effects as those of the second embodiment can also be obtained.

Fourth Embodiment

Figure 19:
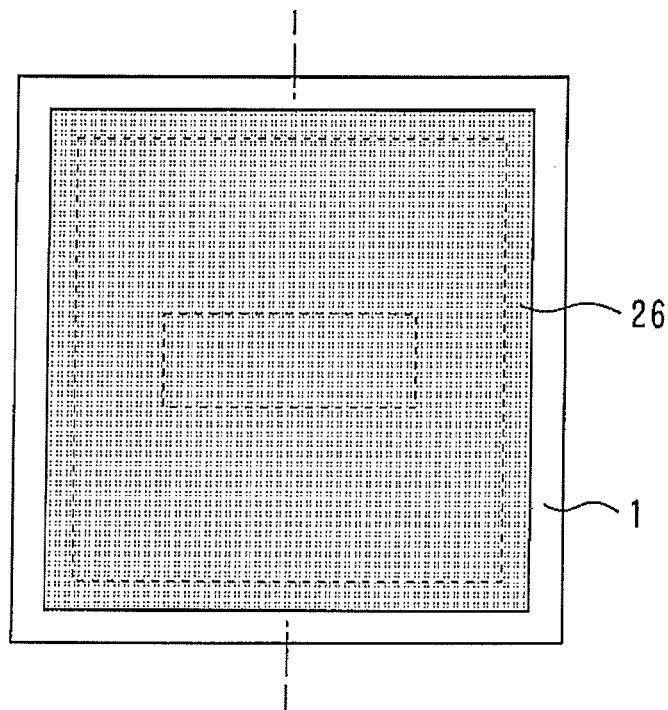
FIG. 19 is a top view of a semiconductor device according to a fourth embodiment of the present invention.
Figure 20:
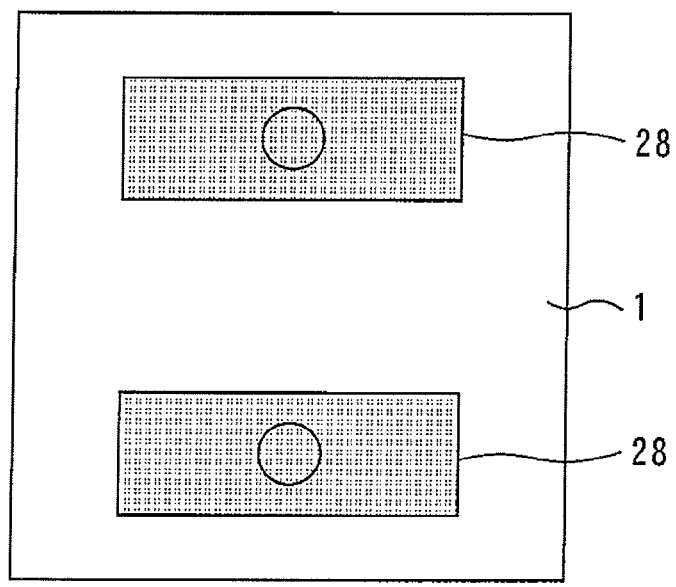
FIG. 20 is a bottom view of the semiconductor device according to the fourth embodiment of the present invention.
Figure 21:
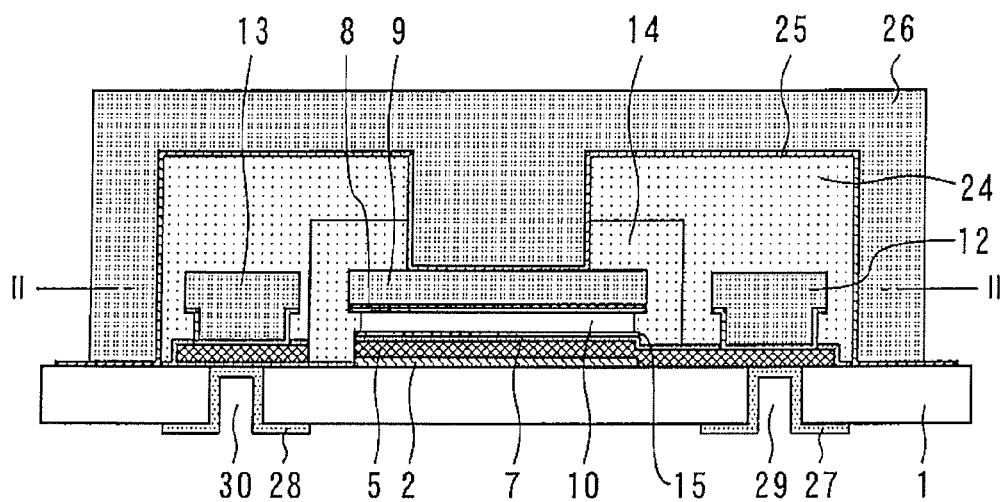
FIG. 21 is a sectional view taken along line I-I in FIG. 19.
Figure 22:
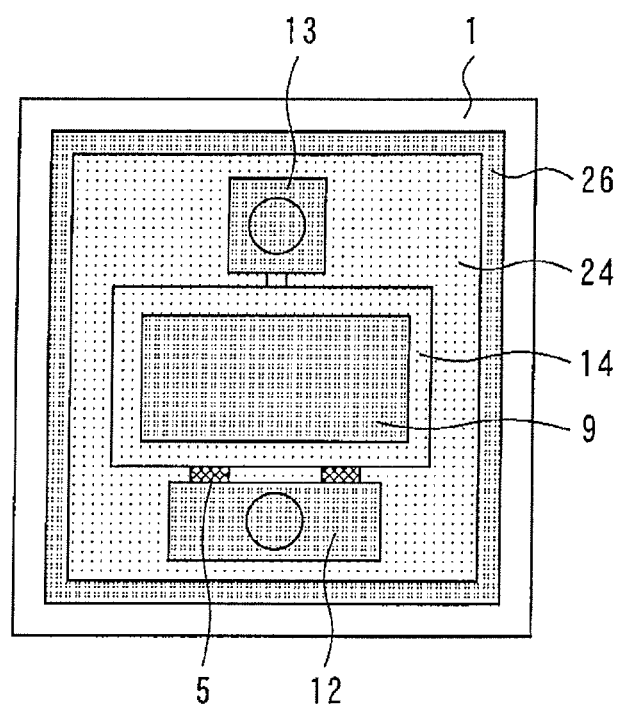
FIG. 22 is a top view at the height corresponding to line II-II in FIG. 21.

FIG. 19 is a top view of a semiconductor device according to a fourth embodiment of the present invention. FIG. 20 is a bottom view of the semiconductor device according to the fourth embodiment of the present invention. FIG. 21 is a sectional view taken along line I-I in FIG. 19. FIG. 22 is a top view at the height corresponding to line II-II in FIG. 21. Description will be made only of points of difference from the first embodiment.

The other end of the drain wiring 5 is jutted out of the polyimide film 14 to be connected to the drain electrode pad 12. The connection (not shown) between the gate wiring connected to the gate electrode 4 and the gate electrode pad 13 is also made in the same way. These components are covered with a photosensitive polyimide film 24.

In the polyimide films 14 and 24, an opening is formed above the plated feed layer 8 and the Au plated layer 9. Through this opening, a plated feed layer 25 and an Au plated layer 26 are joined to the Au plated layer 9. The plated feed layer 25 and the Au plated layer 26 completely cover the plated feed layer 8, the Au plated layer 9 and the polyimide film 14 in the device region and are joined to the semiconductor substrate 1 in an outer peripheral region at the periphery of the device region.

Au plated layers 27 and 28 are provided on the back surface of the semiconductor substrate 1. The Au plated layer 27 is connected to the drain electrode 2 through a via hole 29 penetrating the semiconductor substrate 1 and the drain wiring 5. Also, the Au plated layer 28 is connected to the gate electrode 4 through elements including a via hole 30.

A method of forming the via holes 29 and 30 and the Au plated layers 27 and 28 will be described. First, after forming the plated feed layer 25 and the Au plated layer 26, the thickness of the semiconductor substrate 1 is reduced from the back surface side. Next, the back surface of the semiconductor substrate 1 is dry-etched by using a photoresist as a mask to expose the plated feed layer 25, thereby forming the via holes 29 and 30. An Au plated layer is then formed on the entire surface and a transfer process is performed. The Au plated layer in the unnecessary region is removed after the transfer process, for example, by using an Au etching solution (an aqueous solution mixture of iodine and potassium iodine), thereby forming the Au plated layers 27 and 28.

The effects of the present embodiment will be described. In the present embodiment, the air gap 10 is formed between the plated feed layer 8/Au plated layer 9 and a portion of the main surface. The air gap 10 envelops one end of the drain wiring 5, the gate electrode 4 and the drain electrode 2 in the device region. Thus, no insulating film of a high dielectric constant exists between the semiconductor substrate 1 and the gate electrode 4 and between the semiconductor substrate 1 and the drain electrode 2. Prevention of deterioration of radiofrequency characteristics is thus enabled.

Also, in the present embodiment, the device region is completely covered with the plated feed layer 25 and the Au plated layer 26. Therefore, no path exists through which water can permeate into the device region, as long as separation between the plated feed layer 25 and the semiconductor substrate 1 in the outer peripheral region at the interface between the plated feed layer 25 and the semiconductor substrate 1 is prevented. Further, the materials of the plated feed layer 25 and the Au plated layer 26 are metallic materials markedly resistant to corrosion due to moisture. Covering with the plated feed layer 25 and the Au plated layer 26 therefore enables improving the moisture resistance, and also enables prevention of damage to the device region and the electrode pads completely covered with the plated feed layer 25 and the Au plated layer 26 after forming of the plated feed layer 25 and the Au plated layer 26 in the manufacturing process.

When the semiconductor device according to the present embodiment is implemented by being packaged, a die bonding surface corresponds to the main surface on which the Au plated layer 26 is provided, and wire bonding is performed on each of the Au plated layers 27 and 28 on the substrate back surface.

The present embodiment can be applied to a monolithic microwave integrated circuit (MMIC) in which not only active devices such as transistors but also passive devices including a MIM capacitor and a microstrip line are combined integrally with each other on the main surface of the semiconductor substrate 1. In such a case, the plated feed layer 25 and the Au plated layer 26 completely cover not only the transistors but also the passive devices. This construction enables prevention of deterioration (corrosion) of the passive devices even if the materials of the passive devices are easy to corrode. Active devices may also be formed on the back surface side of the semiconductor substrate 1.

Fifth Embodiment

Figure 23:
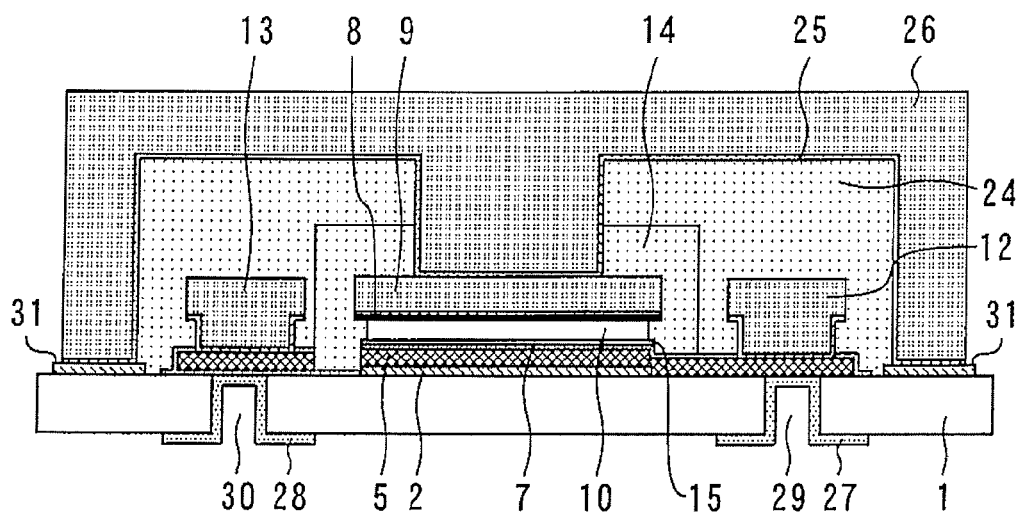
FIG. 23 is a sectional view of a semiconductor device according to a fifth embodiment of the present invention.

FIG. 23 is a sectional view of a semiconductor device according to a fifth embodiment of the present invention. An ohmic metal layer 31 ohmic-joined to the semiconductor substrate 1 is provided in the outer peripheral region of the main surface. The plated feed layer 25 and the Au plated layer 26 are joined to the semiconductor substrate 1 through the ohmic metal layer 31. The other components are the same as those in the fourth embodiment.

When the ohmic metal layer 31 is formed, a eutectic portion is formed between the ohmic metal layer 31 and the semiconductor substrate 1 by heat treatment. Therefore, the strength of adhesion in the interface between the ohmic metal layer 31 and the semiconductor substrate 1 is higher than that in the interface between the plated feed layer 8 and the semiconductor substrate 1. Therefore, separation between the plated feed layer 25 and the semiconductor substrate 1, which may lead to the formation of a path through which water can permeate into the air gap 10, can be limited to improve the moisture resistance.

Sixth Embodiment

Figure 24:
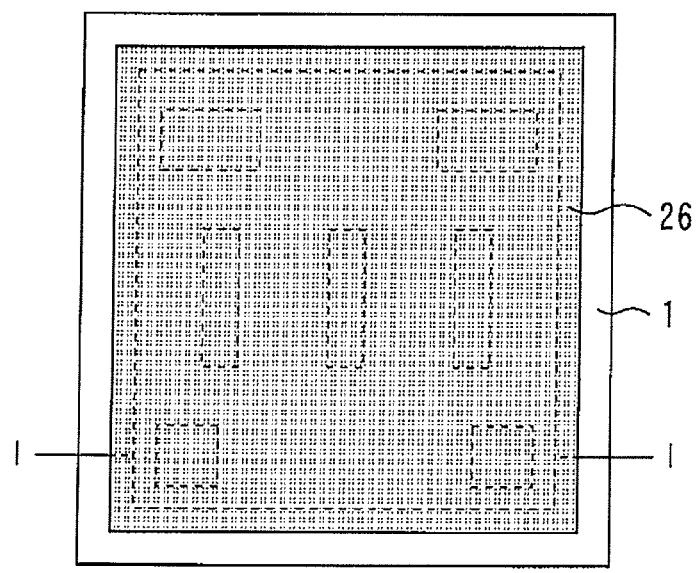
FIG. 24 is a top view of a semiconductor device according to a sixth embodiment of the present invention.
Figure 25:
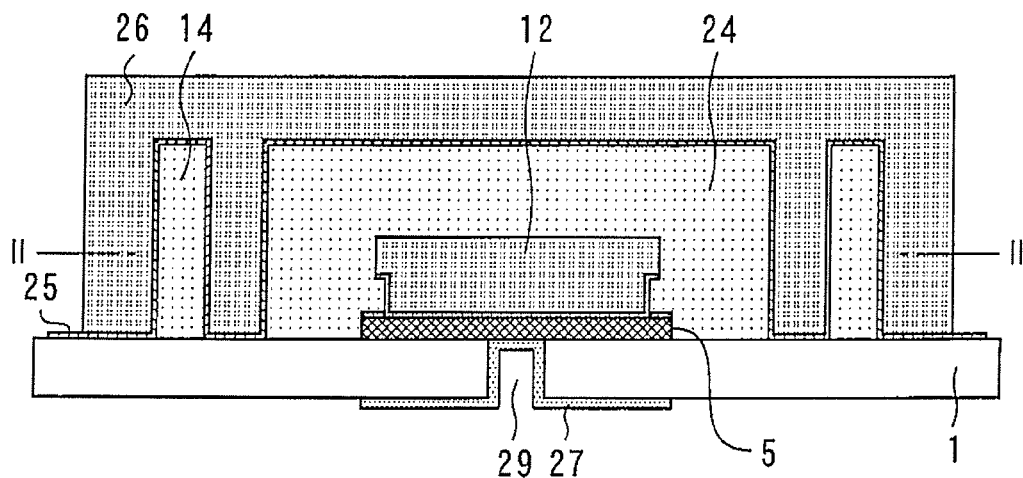
FIG. 25 is a sectional view taken along line I-I in FIG. 24.
Figure 26:
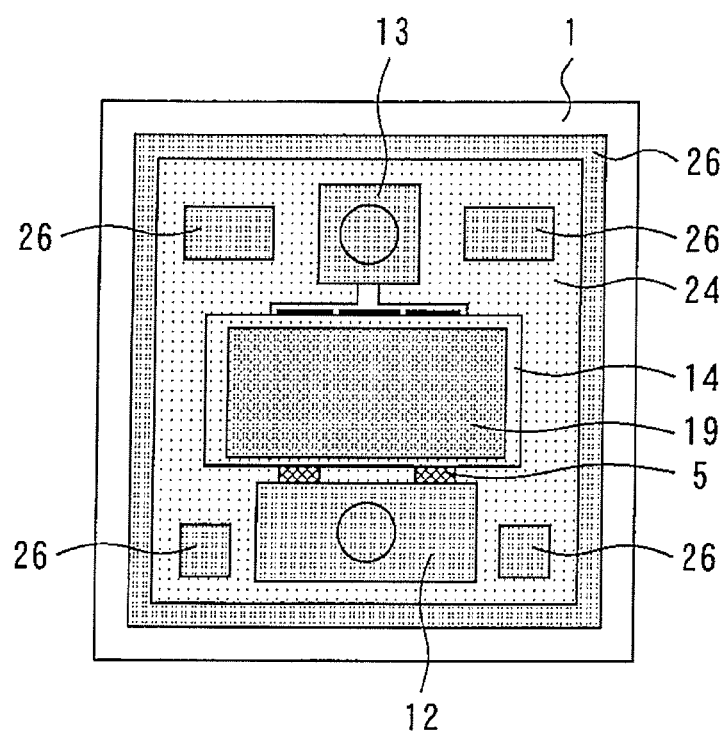
FIG. 26 is a top view at the height corresponding to line II-II in FIG. 25.

FIG. 24 is a top view of a semiconductor device according to a sixth embodiment of the present invention. FIG. 25 is a sectional view taken along line I-I in FIG. 24. FIG. 26 is a top view at the height corresponding to line II-II in FIG. 25.

The plated feed layer 25 and the Au plated layer 26 are also joined to the semiconductor substrate 1 in a region between the device region and the outer peripheral region. This construction enables prevention of occurrence of separation between the plated feed layer 25 and the Au plated layer 26 caused, for example, by an external force applied in the manufacturing process even in a case where the strength of adhesion between the plated feed layer 25 and the semiconductor substrate 1 is low. The construction in the present embodiment can also be applied to the fifth embodiment.

Seventh Embodiment

Figure 27:
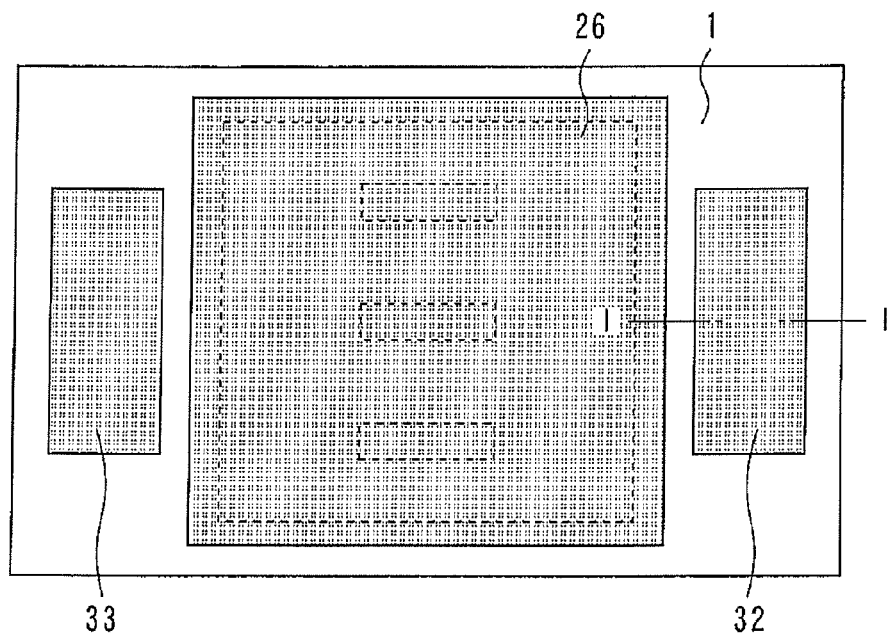
FIG. 27 is a top view of a semiconductor device according to a seventh embodiment of the present invention.
Figure 28:
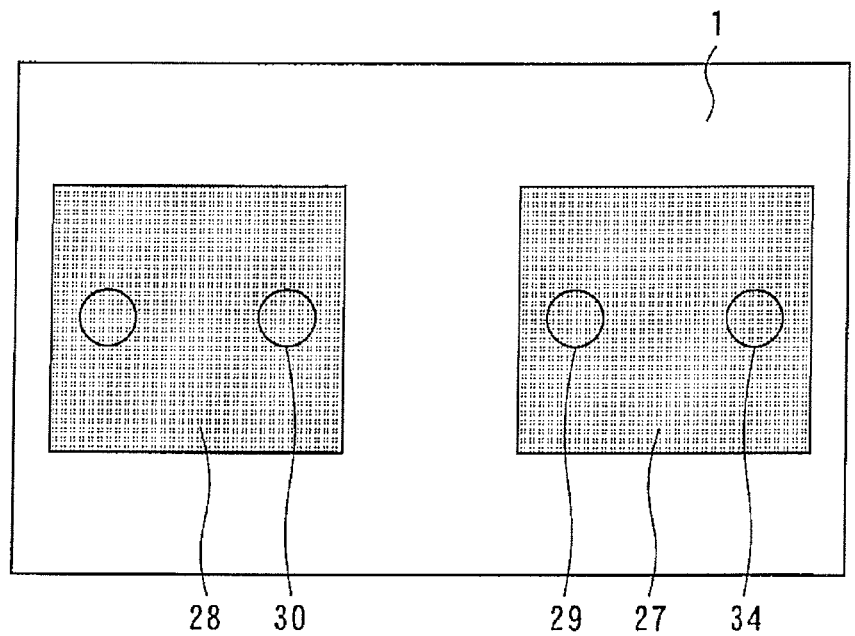
FIG. 28 is a bottom view of the semiconductor device according to the seventh embodiment of the present invention.
Figure 29:
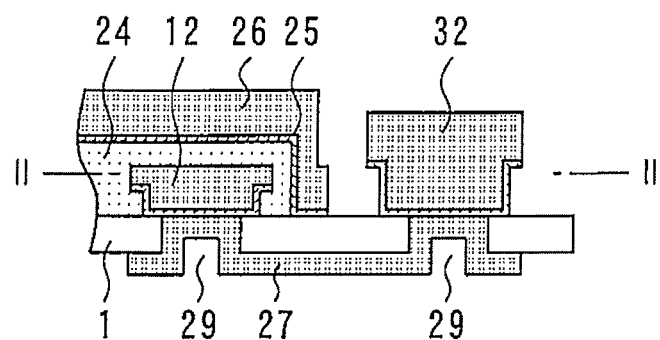
FIG. 29 is a sectional view taken along line I-I in FIG. 27.
Figure 30:
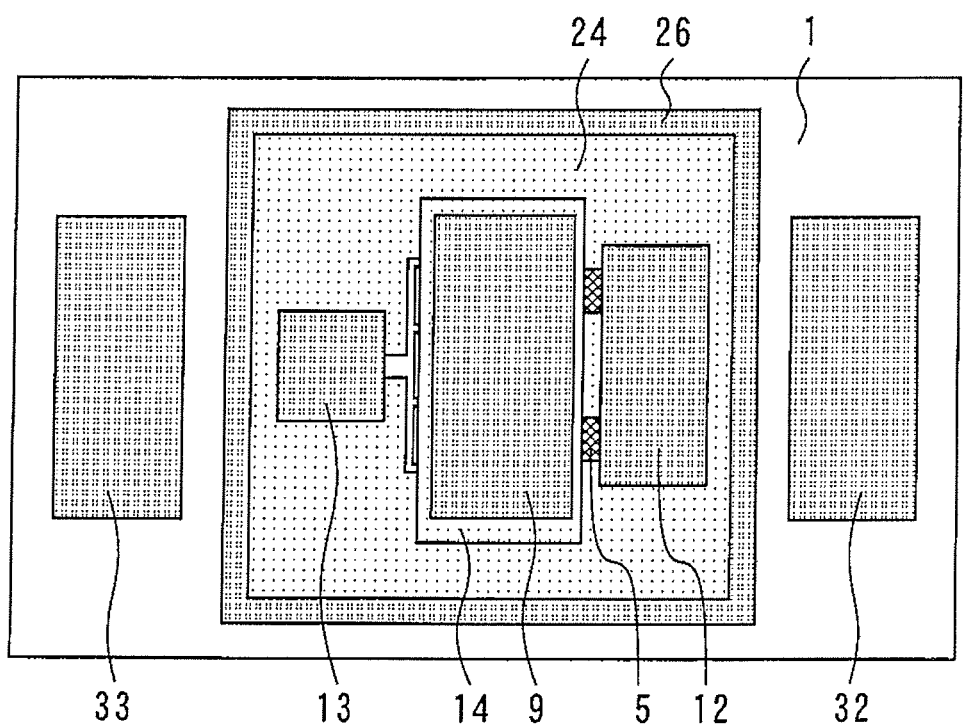
FIG. 30 is a top view at the height corresponding to line II-II in FIG. 29.

FIG. 27 is a top view of a semiconductor device according to a seventh embodiment of the present invention. FIG. 28 is a bottom view of the semiconductor device according to the seventh embodiment of the present invention. FIG. 29 is a sectional view taken along line I-I in FIG. 27. FIG. 30 is a top view at the height corresponding to line II-II in FIG. 29.

Au plated layers 32 and 33 are provided outside the Au plated layer 26 on the main surface. The Au plated layer 32 is connected to the Au plated layer 27 through a via hole 34 penetrating the semiconductor substrate 1. The connection (not shown) between the Au plated layer 28 and the Au plated layer 33 is also made in the same way. The other components are the same as those in the fourth embodiment.

Since external terminals for the gate, source and drain are provided on the main surface of the semiconductor substrate 1 as described above, the semiconductor device is capable of flip-chip mounting. Therefore, the package can be reduced in size and in thickness. The construction in the present embodiment can also be applied to the fifth and sixth embodiments.

Eighth Embodiment

Figure 31:
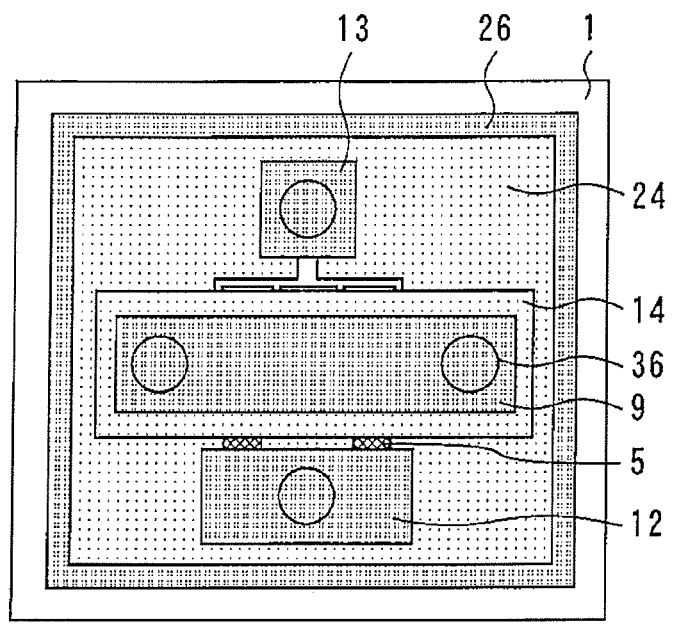
FIG. 31 is a top view of internal portions of a semiconductor device according to an eighth embodiment of the present invention.
Figure 32:
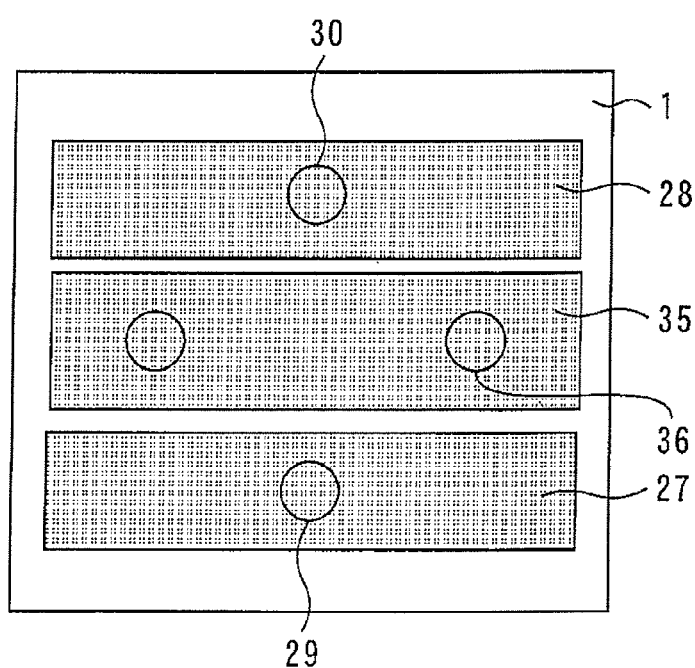
FIG. 32 is a bottom view showing the semiconductor device according to the eighth embodiment of the present invention.

FIG. 31 is a top view of internal portions of a semiconductor device according to an eighth embodiment of the present invention. FIG. 32 is a bottom view showing the semiconductor device according to the eighth embodiment of the present invention.

An Au plated layer 35 is provided on the back surface of the semiconductor substrate 1. The Au plated layer 35 is connected to the plated feed layer 8 and the Au plated layer 9 through a via hole 36 penetrating the semiconductor substrate 1. The other components are the same as those in the fourth embodiment.

Since external terminals for the gate, source and drain are provided on the back surface of the semiconductor substrate 1 as described above, the semiconductor device is capable of surface mounting. The external size of the semiconductor device can be reduced in comparison with the seventh embodiment. Therefore, the package can be further reduced in size and in thickness in comparison with the seventh embodiment. The construction in the present embodiment can also be applied to the fifth and sixth embodiments.

The embodiments have been described with respect to cases where a field effect transistor is provided in the device region on the main surface of the semiconductor substrate 1, but a bipolar transistor having a base electrode, an emitter electrode and a collector electrode may alternatively be provided in the device region.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-190751, filed on Sep. 1, 2011, including specification, claims, drawings, and summary, on which the Convention priority of the present application is based, is incorporated herein by reference in its entirety.

What is claimed is:

1. A semiconductor device comprising:
    a semiconductor substrate having a main surface;
    an electrode in a device region of the semiconductor substrate, on the main surface of the semiconductor substrate;
    a metal wiring on the main surface of the semiconductor substrate and having a first end connected to the electrode and a second end;
    an electrode pad outside the device region on the main surface of the semiconductor substrate and spaced from the metal wiring;
    an air gap forming film on the main surface of the semiconductor substrate;
    an air gap between a part of the main surface of the semiconductor substrate and the air gap forming film, enveloping the first end of the metal wiring and the electrode, and having a first opening;
    a resin closing the first opening and covering the second end of the metal wiring, without covering the electrode pad;
    a liquid repellent film on an internal surface facing the air gap and increasing contact angle of the resin, when in a liquid state, relative to contact angles on the semiconductor substrate and the air gap forming film; and
    a metal film connecting the metal wiring to the electrode pad through a second opening located in the resin, wherein the second end of the metal wiring does not jut out of the resin.

2. The semiconductor device according to claim 1, wherein the metal film completely covers the area directly opposite the first opening.

3. The semiconductor device according to claim 1, wherein the metal film is an air bridge.

4. A method for manufacturing a semiconductor device comprising:
    forming an electrode in a device region on a main surface of a semiconductor substrate;
    forming a metal wiring having a first end connected to the electrode on the main surface of the semiconductor substrate;
    forming an electrode pad spaced from the metal wiring and outside the device region on the main surface of the semiconductor substrate;
    forming an air gap forming film on the main surface of the semiconductor substrate so that an air gap enveloping the first end of the metal wiring and the electrode and having a first opening is located between a part of the main surface of the semiconductor substrate and the air gap forming film;
    closing the first opening and covering a second end of the metal wiring with a resin in liquid form, and, thereafter, curing the resin;
    before forming the resin, forming a liquid repellent film increasing contact angle of the resin, when in a liquid state, relative to contact angles on the semiconductor substrate and the air gap forming metal film, on an internal surface facing the air gap;
    forming a second opening in the cured resin; and
    forming a metal film connecting the second end of the metal wiring to the electrode pad through the second opening, wherein the second end of the metal wiring does not jut out of the resin.

* * * * *